United States Patent [19]
Yang

[11] Patent Number: 5,894,155
[45] Date of Patent: Apr. 13, 1999

[54] METAL GATE HIGH VOLTAGE INTEGRATED CIRCUIT/PROCESS

[75] Inventor: Sheng-Hsing Yang, Hsinchu, Taiwan

[73] Assignee: United Microelectronics Corporation, Taiwan

[21] Appl. No.: 08/947,915

[22] Filed: Oct. 9, 1997

Related U.S. Application Data

[60] Continuation of application No. 08/582,773, Jan. 4, 1996, abandoned, which is a division of application No. 08/144,261, Nov. 1, 1993, Pat. No. 5,498,553.

[51] Int. Cl.$^6$ .......................... H01L 29/76; H01L 29/94; H01L 31/062; H01L 31/13
[52] U.S. Cl. .......................... 257/371; 257/369
[58] Field of Search .......................... 257/371, 369

[56] References Cited

U.S. PATENT DOCUMENTS

| | | | |
|---|---|---|---|
| 4,474,624 | 10/1984 | Matthews | 257/371 |
| 5,102,816 | 4/1992 | Manukonda et al. | 257/344 |

OTHER PUBLICATIONS

Muller et al, *Device Electronics for IC'S*, pp. 463 and 381, 1986.

"A Novel CMOS–Compatible High–Voltage Transistor Structure" IEEE Trans Electron Devices, vol. ED–33 pp. 1948–1952 (Dec. 1986).

R. Jayaraman et al, "Comparison of High Voltage Devices for POwer Integrated Circuits", pp. 258–261 IEDM'84.

*Primary Examiner*—Stephen Meier
*Attorney, Agent, or Firm*—Rabin & Champagne, P.C.

[57] ABSTRACT

A semiconductor is made on a silicon substrate containing an impurity of a predetermined polarity having formed therein a well containing an impurity of an opposite polarity to a region in the silicon is provided. The method comprises forming a first masking layer on the surface of the substrate, providing openings in the masking layer and implanting dopant ions of a first polarity into the surface of the substrate in a set of first implant regions in the well on either side of a first central region in the well and in a set of second implant regions adjacent to the well on either side of a second central region adjacent to the well, formation of insulating structures over the first and second regions, forming gate oxide layers above the first and second central regions, forming a second masking layer on the surface of the substrate, providing openings in the masking layer and implanting dopant ions of a second polarity into the surface of the substrate in a set of second implant regions in the well on either side of a first central region in the well and in a set of fourth implant regions adjacent to the well on either side of a second central region adjacent to the well, and formation of conductive gate structures over the gate oxide layers.

17 Claims, 13 Drawing Sheets

METAL GATE HIGH VOLTAGE INTEGRATED CIRCUIT/PROCESS

This is a continuation of application Ser. No. 08/582,773, filed Jan. 4, 1996 and now abandoned, which was a divisional of application Ser. No. 08/144,261, filed Nov. 1, 1993 and now U.S. Pat. No. 5,498,553.

BACKGROUND OF THE INVENTION

1. Field of the Invention

This invention relates to metal gate high voltage integrated circuits/processes and more particularly to the cycle time of such devices.

2. Description of Related Art

Z. Parpia et al "A Novel CMOS-Compatible High-Voltage Transistor Structure" IEEE Trans Electron Devices, Vol. ED-33, pp. 1948–1952 (December 1986) (reprint pages 116–120) describes a process wherein there is a polysilicon gate lithography alignment problem with the P− region. In LSI technology the P-well P-region is always the first step, the device channel region is in the P-well region or under the polysilicon gate, so the layout must have a longer channel to prevent the polysilicon layer misalignment form the P-well region.

R. Jayaraman et al "Comparison of High Voltage Devices for Power Integrated Circuits" pp. IEDM 84 258–261 (1984) describes a process wherein the P− implant (which is always the P-well implant is performed before the metal gate is formed. The reason that forming the gate after the P− implant is a disadvantage is that although it is the metal gate, but the alignment problem remains, so the layout must have a longer channel length.

Note that in the Parpia et al and Jayaraman et al the device structures are implement in CMOS and so the source side cannot be operated at a high voltage.

SUMMARY OF THE INVENTION

In accordance with this invention, a method of fabrication of an semiconductor device on a silicon substrate containing an impurity of a predetermined polarity having formed therein a well containing an impurity of an opposite polarity to a region in the silicon is provided.

The method comprises a) forming a first masking layer on the surface of the substrate, b) providing openings in the masking layer and implanting dopant ions of a first polarity into the surface of the substrate in a set of first implant regions in the well on either side of a first central region in the well and in a set of second implant regions adjacent to the well on either side of a second central region adjacent to the well, c) formation of insulating structures over the first and second regions, d) forming gate oxide layers above the first and second central regions, e) forming a second masking layer on the surface of the substrate, f) providing openings in the masking layer and implanting dopant ions of a second polarity into the surface of the substrate in a set of second implant regions in the well on either side of a first central region in the well and in a set of fourth implant regions adjacent to the well on either side of a second central region adjacent to the well, and i) formation of conductive gate structures over the gate oxide layers.

Preferably, the conductive gate structures extend over the top of the gate oxide layers juxtaposed therewith; the conductive gate structures comprises a metal; and the metal comprises aluminum.

A method of fabrication of an semiconductor device in a silicon substrate doped an impurity of a predetermined, first polarity, and a well formed therein containing an impurity of an opposite polarity to a region in the silicon substrate, the method comprising a) forming a first masking layer on the surface of the substrate, b) a first ion implanting step for implanting dopant ions of the first polarity into the surface of the substrate in a set of first implant regions in the well on either side of a first central region in the well and in a set of second implant regions adjacent to the well on either side of a second central region adjacent to the well, c) forming a second masking layer on the surface of the substrate, d) a second ion implanting step for implanting dopant ions of the first polarity into more highly doped regions in the first and second implant regions in the well on either side of a first central region in the well and in a set of second implant regions adjacent to the well on either side of a second central region adjacent to the well, e) formation of insulating structures over the first and second implant regions, f) forming a third masking layer on the surface of the substrate, g) a third ion implanting step for implanting dopant ions of the opposite polarity into the surface of the substrate and the well in third and fourth implant regions adjacent to the first and second implant regions, h) forming a fourth masking layer on the surface of the substrate, i) a fourth ion implanting step for implanting dopant ions of the opposite polarity into more highly doped regions in the third and fourth implant regions in the well on either side of a first central region in the well and in a set of second implant regions adjacent to the well on either side of a second central region adjacent to the well, j) formation of additional insulating structures over the third and fourth implant regions, k) forming gate oxide layers above the first and second central regions, and l) formation of conductive gate structures over the gate oxide layers.

Preferably, the chemical species of the dopant implanted in the first ion implanting step comprises phosphorous with a dose from about 3 E 12 atoms/cm$^2$ to about 7 E 12 atoms/cm$^2$, at an energy of from about 100 keV to about 180 keV in a high current implanter type of tool providing a surface concentration of from about $8\times10^{15}$ atoms/cm$^3$ to about $1\times10^{17}$ atoms/cm$^3$.

Preferably, the chemical species of the dopant implanted in the second ion implanting step comprises arsenic with a dose of from about 1 E 15 atoms/cm$^2$ to about 5 E 15 atoms/cm$^2$, at an energy of from about 50 keV to about 100 keV in a high current implanter type of tool providing a surface concentration of from about $1\times10^{19}$ atoms/cm$^3$ to about $5\times10^{19}$ atoms/cm$^3$.

Preferably, the chemical species of the dopant implanted in the third ion implanting step employs boron with a dose of from about 1 E 13 atoms/cm$^2$ to about 1 E 13 atoms/cm$^2$, at an energy of from about 80 keV to about 150 keV in a high current implanter type of tool providing a surface concentration of from about $1\times10^{16}$ atoms/cm$^3$ to about $3\times10^{17}$ atoms/cm$^3$.

Preferably, a fourth ion implanting step is performed in the product of the second ion step of opposite polarity thereto, the chemical species of the dopant implanted in the fourth ion implanting step comprises boron with a dose of from about 1 E 15 atoms/cm$^2$ to about 4 E 15 atoms/cm$^2$, at an energy of from about 50 keV to about 90 keV in a high current implanter type of tool providing a surface concentration of from about $8\times10^{18}$ atoms/cm$^3$ to about $3\times10^{19}$ atoms/cm$^3$.

BRIEF DESCRIPTION OF THE DRAWINGS

The foregoing and other aspects and advantages of this invention are explained and described below with reference to the accompanying drawings, in which.

Next, the oxide layer above the nitride layer is etched away exposing the surface of the nitride layer. Next, the nitride layer is removed exposing the gate channel region between the oxidation structures. Bass oxide etching is performed next for the gate channel region where the nitride layer was removed between the regions.

A photolithographic process has formed the photoresist mask on the product of FIGS. 11A and 11B using the process described above. Openings (not shown) for electrical contacts to the source and drain and substrate contact have been formed, and contacts have been formed by the process of slope etching. Then the photoresist mask is removed.

Next, metal is sputtered onto the wafer for forming a gate. Next, metal etching is performed by a process of dry or wet etching.

DESCRIPTION OF THE PREFERRED EMBODIMENT

Figure 1A:
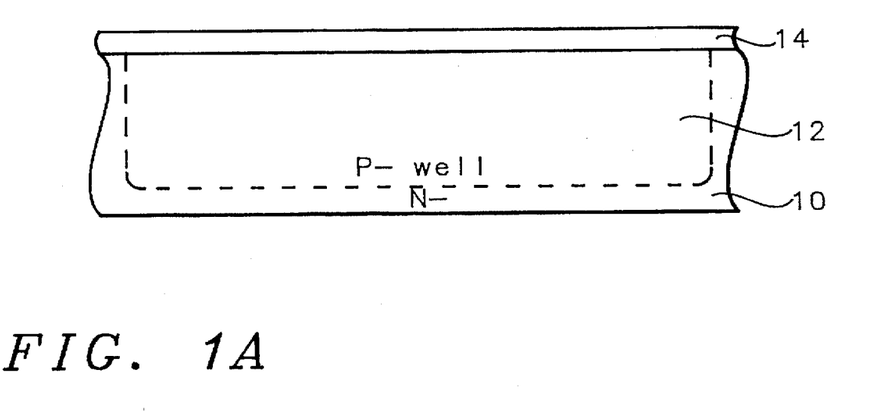
FIG. 1A illustrates the first stage of formation of the NMOS portion of a CMOS semiconductor device in accordance with this invention.
Figure 1B:
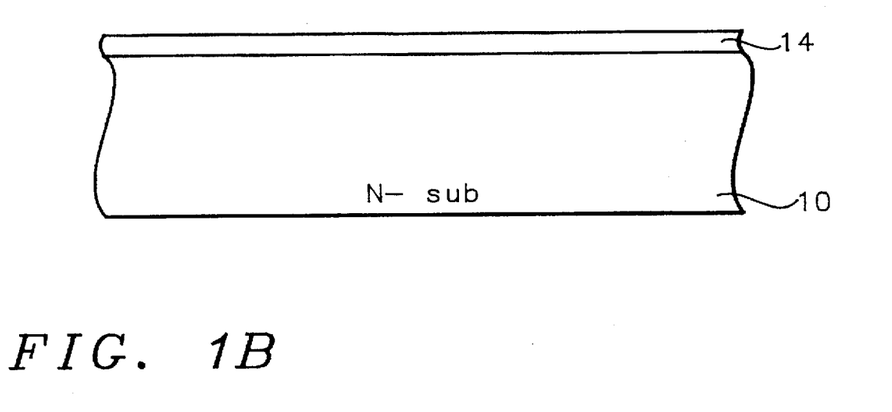
FIG. 1B, the first stage of formation of the PMOS portions of the CMOS device of FIG. 1A.

FIG. 1A illustrates the first stage of formation of the NMOS portion of CMOS semiconductor substrate 10 is shown, which is to be formed into a CMOS transistor device. In FIG. 1B, the first stage of formation of the PMOS portions of the CMOS device in accordance with this invention is illustrated. The substrate 10 has previously had impurities introduced therein providing N-sub doping. In the initial stages the substrate 10 has a silicon diozide layer (not shown) applied thereto. In FIG. 1A, A P− well 12 had been formed in substrate 10 by means of a preliminary ion implant step comprising a P− well implant and P− well drive in process. As shown in FIG. 1B, the PMOS portion of the device does not include a P− well but simply the substrate 10 and the silicon dioxide layer 14.

The P− ions 33 are implanted in a first ion implant process the regions 34, 35, 74 and 75. The chemical species of the dopant implanted is preferably boron (B) with a dose within an operable range of from about 3 E 12 atoms/cm$^2$ to about 6 E 12 atoms/cm$^2$ at an energy of from about 80 keV to about 120 keV in a high current implanter type of tool. The optimum dose is also within the range of from about 3 E 12 atoms/cm$^2$ to about 6 E 12 atoms/cm$^2$, resulting in a concentration of P− dopant from about $3\times10^{15}$ atoms/cm$^3$ to about $7\times10^{15}$ atoms/cm$^3$.

Then in both FIGS. 1A and 1B, the initial silicon dioxide layer is removed from substrata 10, and a bass oxidation is performed forming a bass silicon dioxide layer 14 on the exposed surface of substrate 10 covering the substrata 10 and P− wells 12 as well wherever either is exposed.

Figure 2A:
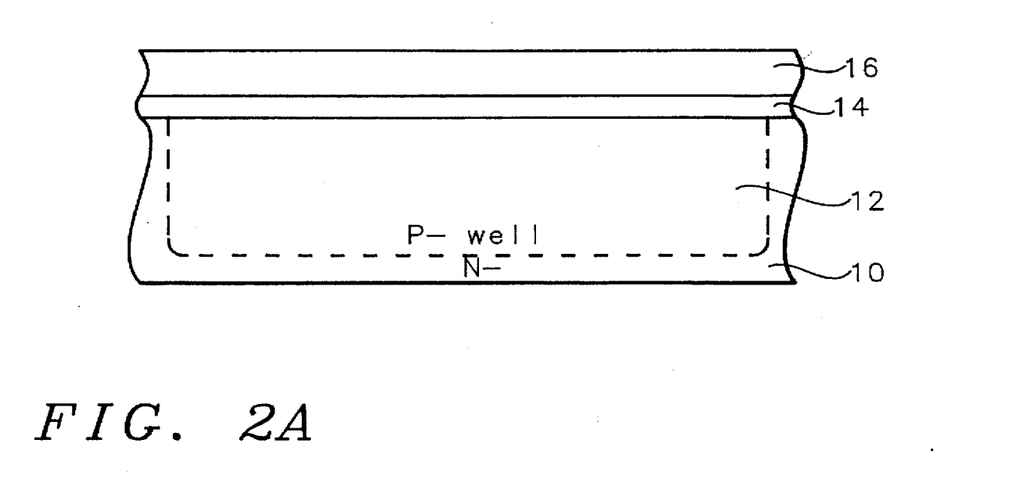
FIGS. 2A and 2B, show a bass oxidation and silicon nitride are applied to the device of FIGS. 1A and 1B.
Figure 2B:
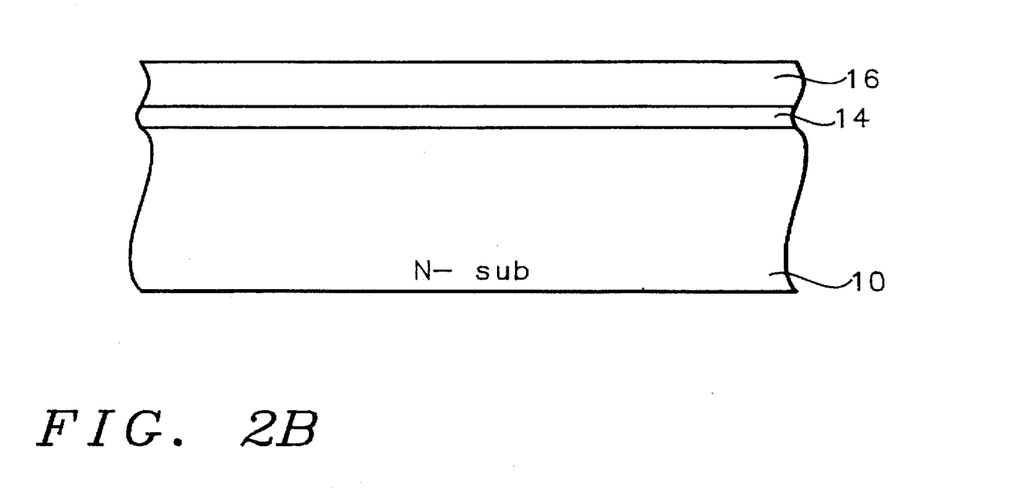

As shown in FIGS. 2A and 2B, the nest step is that a bass oxidation is performed forming a silicon dioxide bass layer 14 on the exposed surface of substrate 10. Next a nitride layer 16 of silicon nitride Si$_3$N$_4$ is formed.

Referring again to FIGS. 2A and 2B, the next step in the process of forming the CMOS device is that a nitride layer 16 of silicon nitride Si$_3$N$_4$ is formed on the surface of the silicon dioxide base layer 14. Subsequently, a photoresist layer 17 is applied to the exposed surface of the nitride layer 16.

Figure 3A:
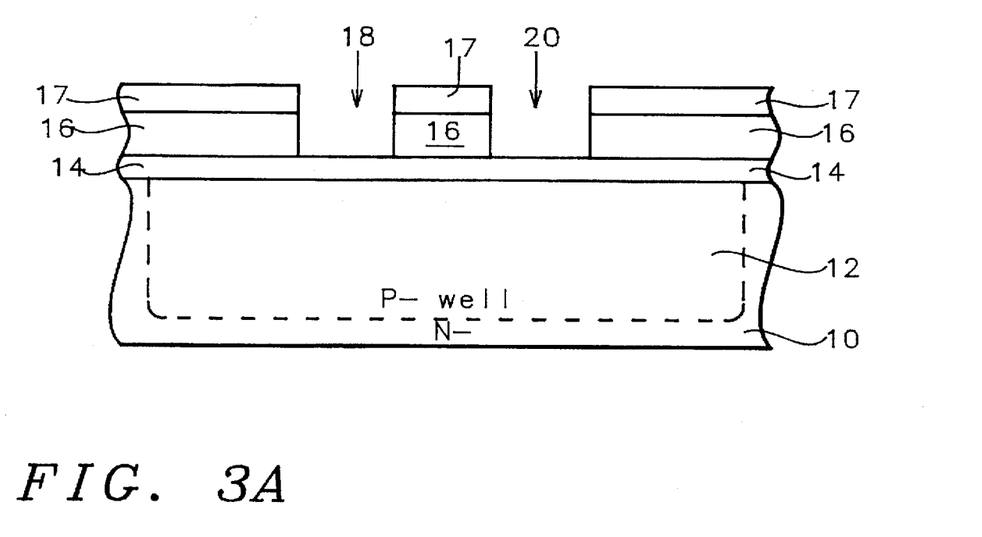
FIGS. 3A and 3B show the device of FIGS. 2A and 2B with photoresist mask for forming openings through which the nitride layer is etched down to the silicon dioxide in each opening.
Figure 3B:
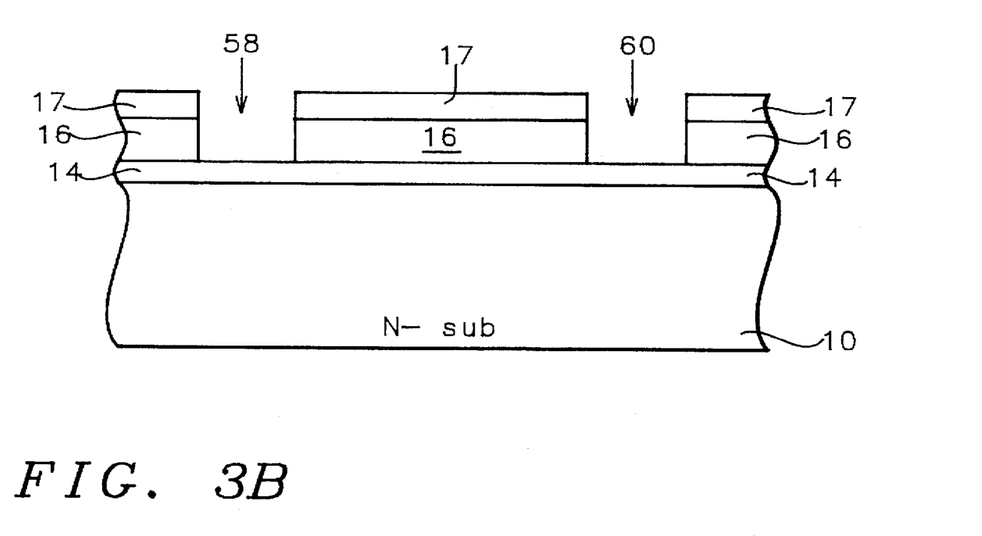

In FIGS. 3A and 3B the device with photoresist layer 17 has been aligned with a mask, exposed by the mask and developed to form openings 18 and 20 in FIG. 3A and openings 58 and 60 in FIG. 3B. Then the nitride layer 16 is etched through those openings in the photoresist mask 17, down to the silicon dioxide 14 in each opening.

Subsequently, a photoresist layer is applied to the exposed surface of the nitride layer 16, as was done in FIG. 3A. The device with that photoresist layer is been aligned with a mask, exposed by the mask and developed to form openings. Then the nitride layer 16 is etched down to the silicon dioxide 14.

Figure 4A:
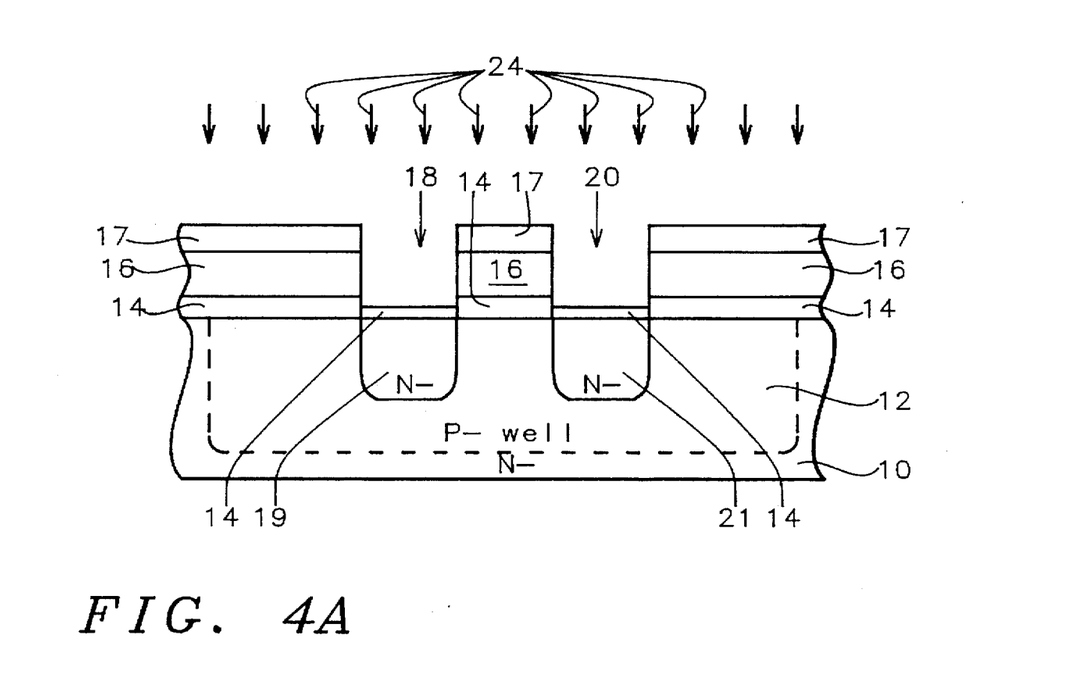
FIGS. 4A and 4B, shows a first N− ion implant process being performed by ions passing through openings in the photoresist layer down into local regions in the substrate.
Figure 4B:
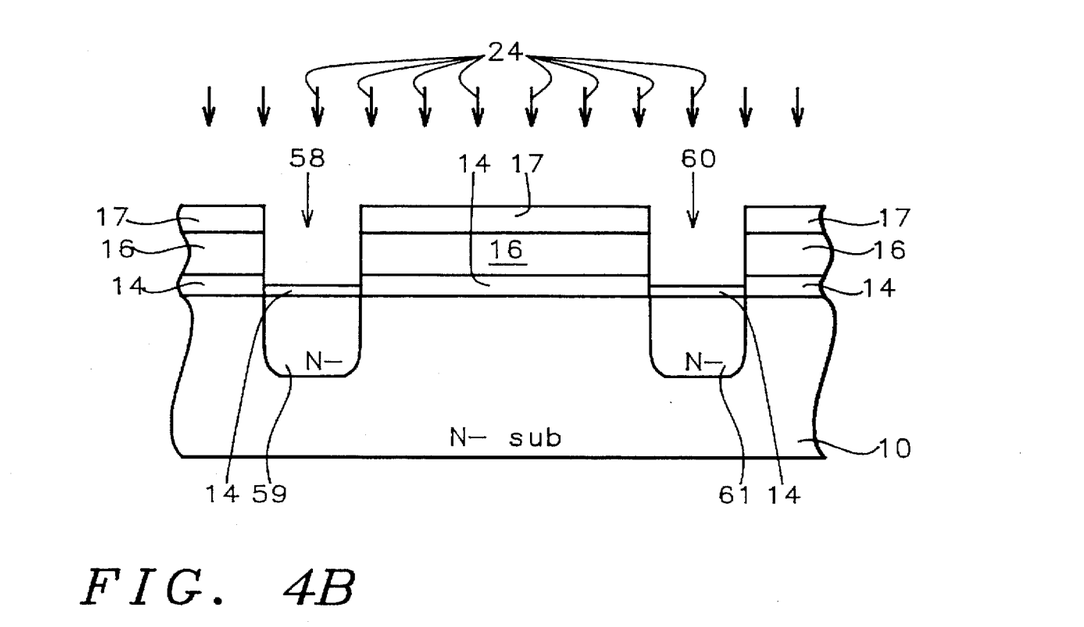

Then, referring to FIGS. 4A and 4B a first, N−, ion implant process is performed by ions 24 passing through openings 18 and 20 in FIG. 4A and openings 56 and 60 in FIG. 4B. (where the photoresist layer 17 does not provide a shield) down into local regions 19 and 21 respectively in FIG. 4A and 59 and 61 respectively in FIG. 42. The N− ions are implanted in the substrate 10. The chemical species of the dopant implanted is preferably phosphorous (P) with a dose within an operable range of from about 3 E 12 atoms/cm$^2$ to about 7 E 12 atoms/cm$^2$ at an energy of from about 100 keV to about 180 keV in a high current implanter type of tool. The optimum dose is within the range of from about 3 E 12 atoms/cm$^2$ to about 7 E 12 atoms/cm$^2$ resulting in a concentration of N− dopant from about $8 \times 10^{15}$ atoms/cm$^3$ to about $1 \times 10^{17}$ atoms/cm$_3$.

Figure 5A:
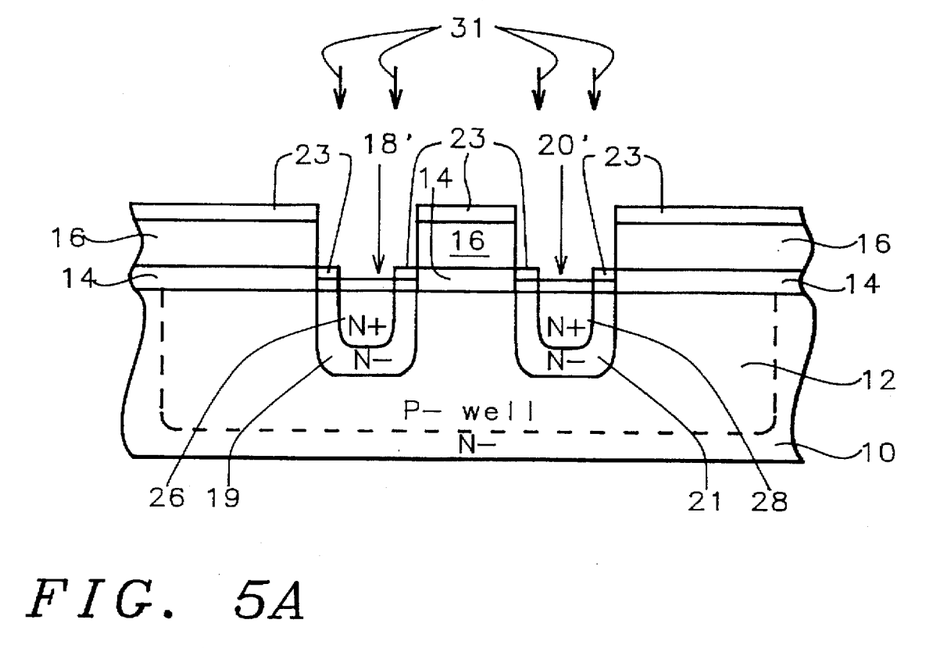
FIGS. 5A and 5B shows that the resist layer is removed and replaced with another coating of photoresist applied over the product of FIGS. 4A and 4B.
Figure 5B:
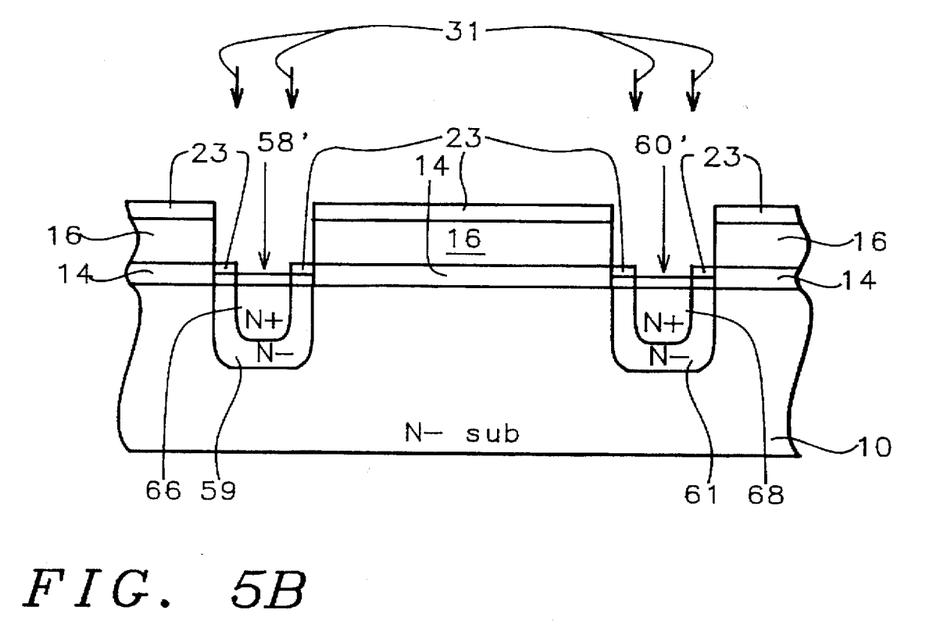

At this point referring to FIGS. 5A and 5B, the resist layer 17 is removed. After the resist layer 17 is removed, a coating of photoresist 23 is applied over the product of FIGS. 4A and 4B. The resist layer 23 is aligned for the H+ mask, exposed through the mask and layer 23 is developed. The result is openings in layer 23 including openings 18' and 20' shown in FIG. 5A and openings 58' and 60' in FIG. 5B over the central areas of the surfaces of N− regions 19 and 21 and N− regions 59 and 61 respectively. The resist layer 23 is aligned for the N+ mask, exposed through the mask and developed. The result is openings 58' and 60' over the central areas of the surfaces of N− regions 59 and 61.

Then a second ion implant comprising an N+ ion implant of ions 31 is performed through openings 18', 20' in FIG. 5A and 58' and 60' in FIG. 5B, (where the photoresist layer 23 does not provide a shield) down into local regions 26 and 28 in regions 19 and 21 in FIG. 5A and local regions 66 and 68 in regions 59 and 61 in FIG. 5B. That is, the N+ ions 31 are implanted in the local regions 26, 28, 66, and 68 in respective regions 19, 21, 59, and 61 in substrate 10. The chemical species of the dopant implanted is preferably aresenic (As) with a dose within an operable range of from about 1 E 15 atoms/cm$^2$ to about 5 E 15 atoms/cm$^2$ at an energy of from about 50 keV to about 100 keV in a high current implanter type of tool. The optimum dose is within the range of from about 1 E 15 atoms/cm$^2$ to about 5 E 15 atoms/cm$^2$, resulting in a concentration of N+ dopant from about $1 \times 10^{19}$ atoms/cm$^3$ to about $5 \times 10^{19}$ atoms/cm$^3$.

The next step is to perform a conventional process of removing the resist layer 23. Following the implantation of the N− ions 24, etching of the silicon dioxide 14 down to the surface of the semiconductor 10 above new N− regions 19, 21, 59 and 61 is performed.

Figure 6A:
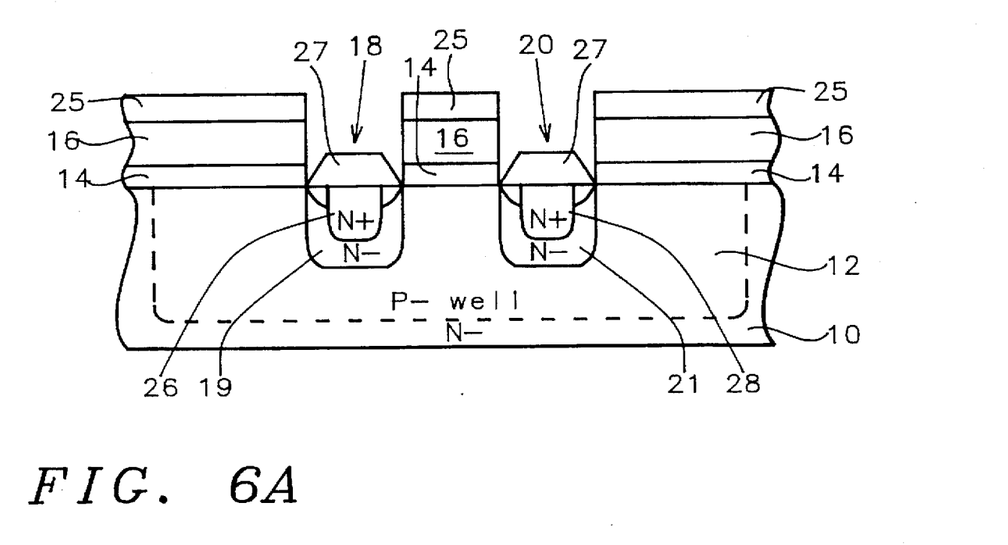
FIGS. 6A and 6B, shows an N type oxidation being performed on the resist and oxide free surfaces exposed on the product of FIGS. 5A and 5B producing N oxidation structures.
Figure 6B:
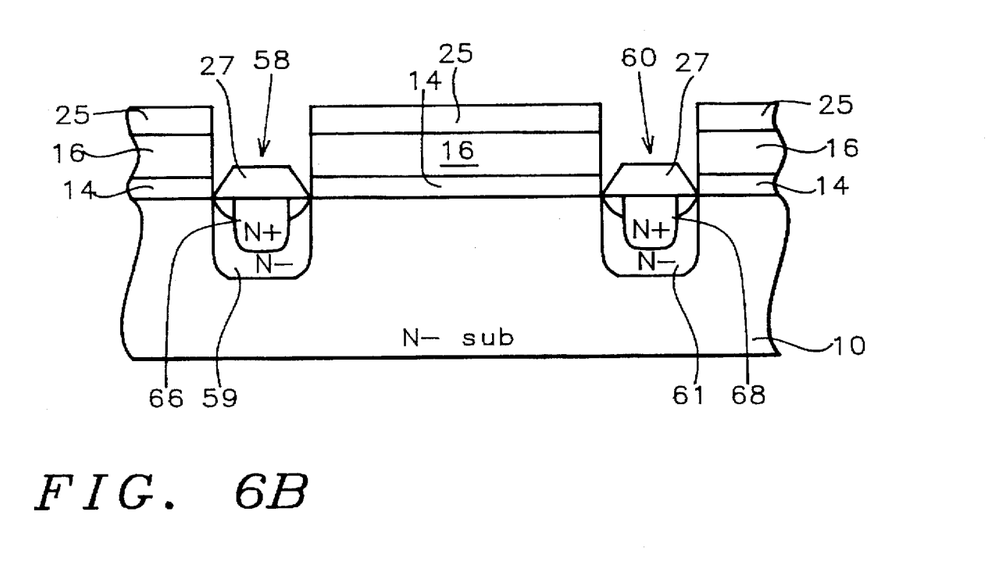

As shown in FIGS. 6A and 6B, an N type oxidation is performed on the resist and oxide free surfaces exposed on the product of FIGS. 5A and 5B producing the N oxidation structures 27 in openings 18, 20, 58 and 60 above the N doped regions 19, 21, 59 and 61 as well as forming an oxide structures 25 above the silicon nitride layer 16, caused by the N type oxidation.

Figure 7A:
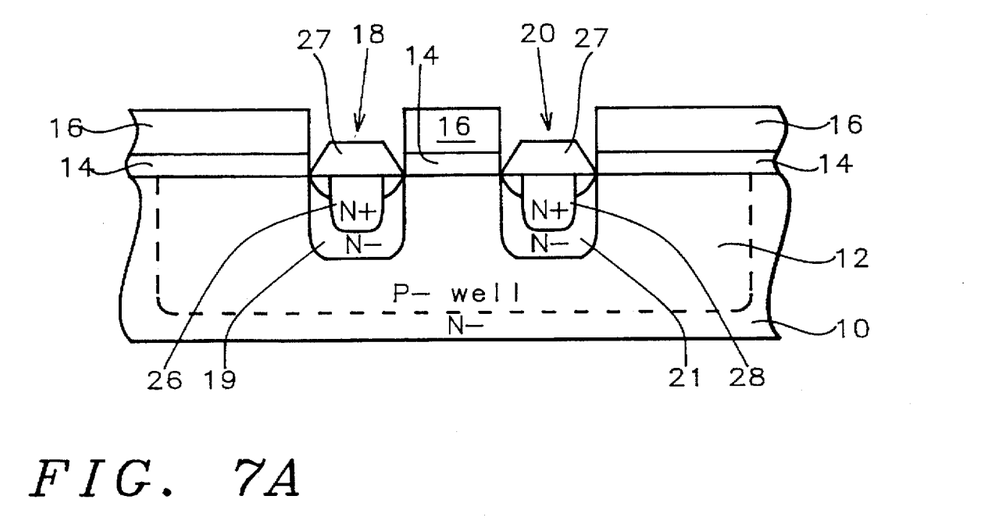
FIGS. 7A and 7B show removing the oxide structure above the silicon nitride layer.
Figure 7B:
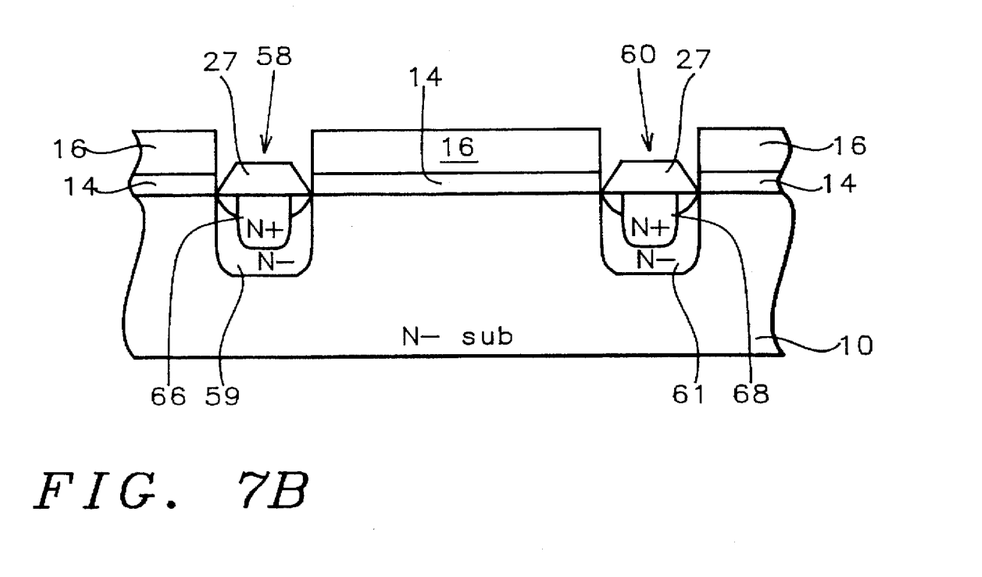

Referring to FIG. 7A and 7B, The next step is to remove the oxide structure 25 above the silicon nitride layer 16.

Figure 8A:
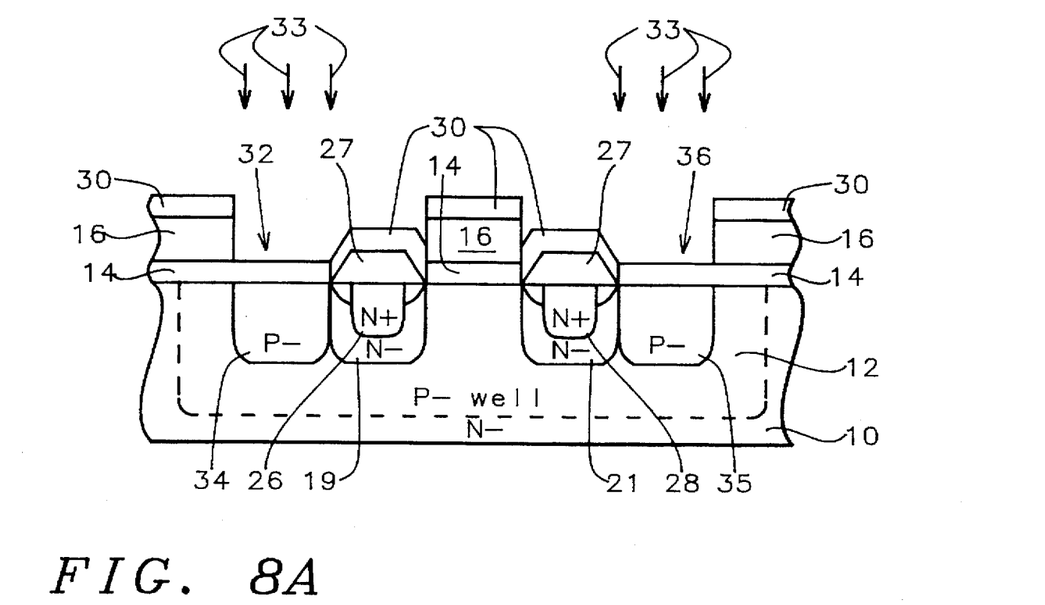
FIGS. 8A and 8B show a layer of photoresist applied to the surface of the product of FIG. 7A and 7B and a P− mask is aligned with the product of FIGS. 7A and 7B. The photoresist is exposed, developed providing the shape shown in FIG. 8A and 8B with new openings; and a third ion implant process is performed as P− ions are ion implanted into the regions of P− well and the substrates.
Figure 8B:
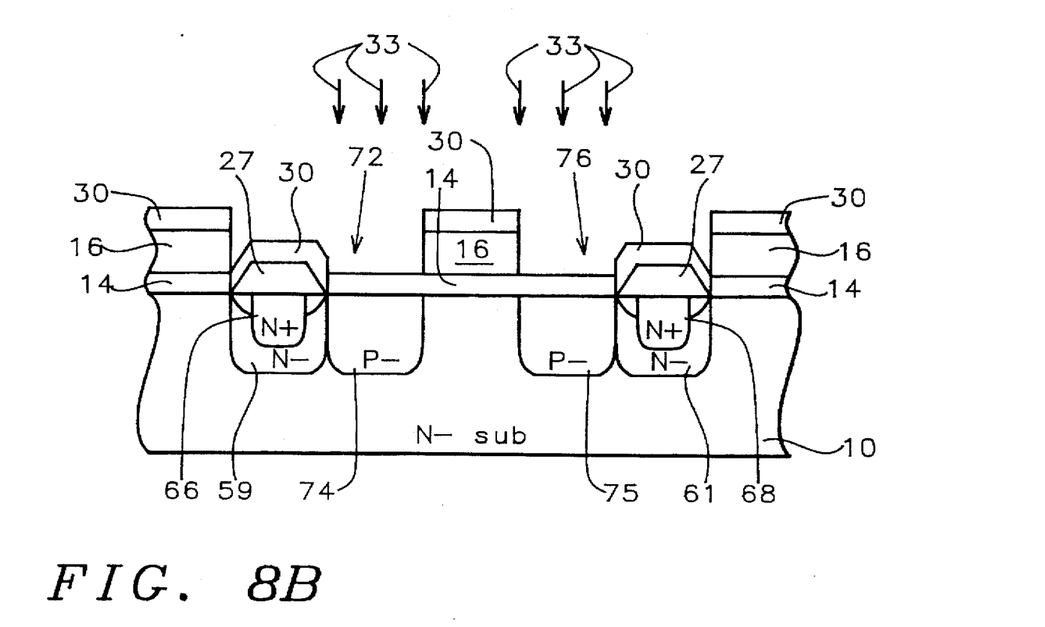

Next, as shown in FIG. 8A and 8B a layer of photoresist 30 is applied to the surface of the product of FIG. 7A and 7B and a P− mask is aligned with the product of FIG. 7A and 7B, and the photoresist 30 is exposed through that mask and the photoresist 30 is developed providing the shape shown in FIG. 8A and 8B with new openings 32 and 36 in FIG. 8A and new openings 72 and 74 in FIG. 8B.

In the next step, referring again to FIGS. 8A and 8B, the silicon nitride layer 16 is etched down through the openings 32, 36, 72 and 76 in photoresist layer 30 where the silicon dioxide layer 14 remains below.

Referring again to FIGS. 8A and 8B, the next step is that a third ion implant process is performed as P− ions 33 are ion implanted into the regions of P− well 12 below the openings 32, 36, 72 and 76 in the layer 30 and the silicon nitride layer 16 into regions 34 and 35 in P− well 12 in FIG. 8A and regions 74 and 75 in FIG. 8B. The P− ions 33 are implanted in the regions 34, 35, 74 and 75. The chemical species of the dopant implanted is preferably boron (B) with a dose within an operable range of from about 1 E 13 atoms/cm$^2$ to about 8 E 13 atoms/cm$^2$ at an energy of from about 80 keV to about 150 keV in a high current implanter type of tool. The optimum dose is also within the range of from about 1 E 13 atoms/cm$^2$ to about 8 E 13 atoms/cm$^2$, resulting in a concentration of P-dopant from about $1 \times 10^{16}$ atoms/cm$^3$ to about $3 \times 10^{17}$ atoms/cm$^3$.

Figure 9A:
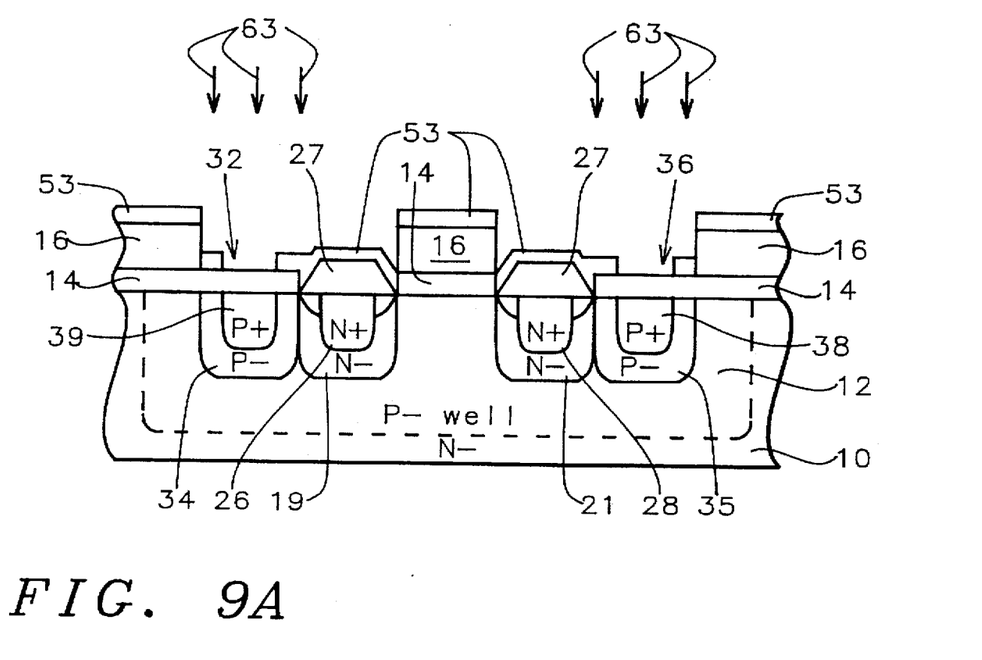
FIGS. 9A and 9B show removal of resist and addition of a new layer of resist, exposed and developed. At this point the fourth ion implant process is performed in accordance with this invention.
Figure 9B:
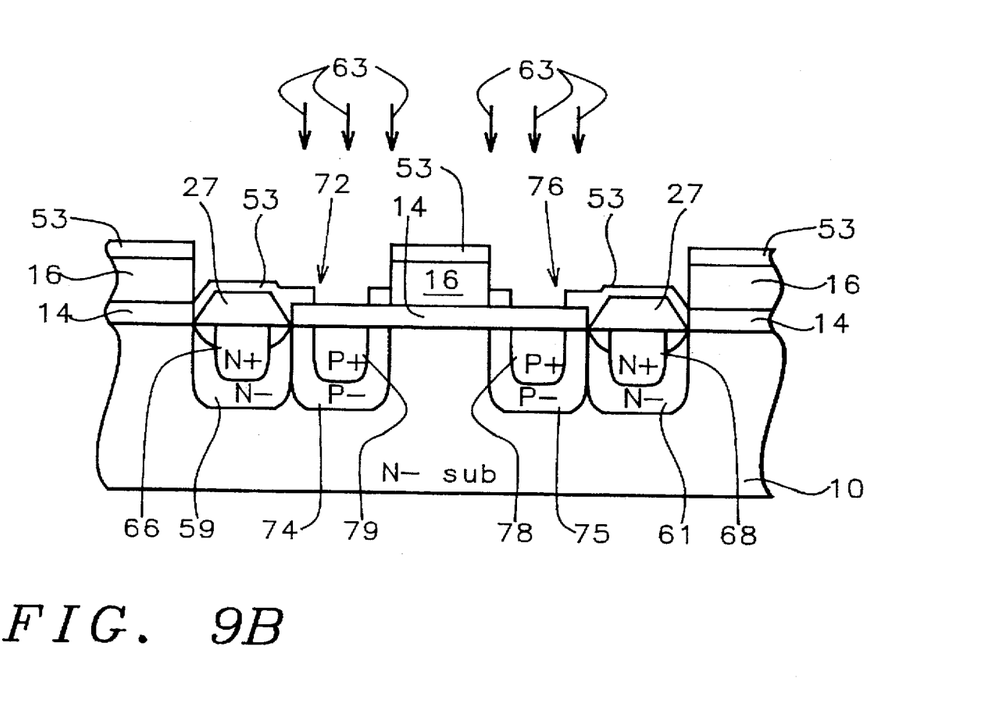
Figure 10A:
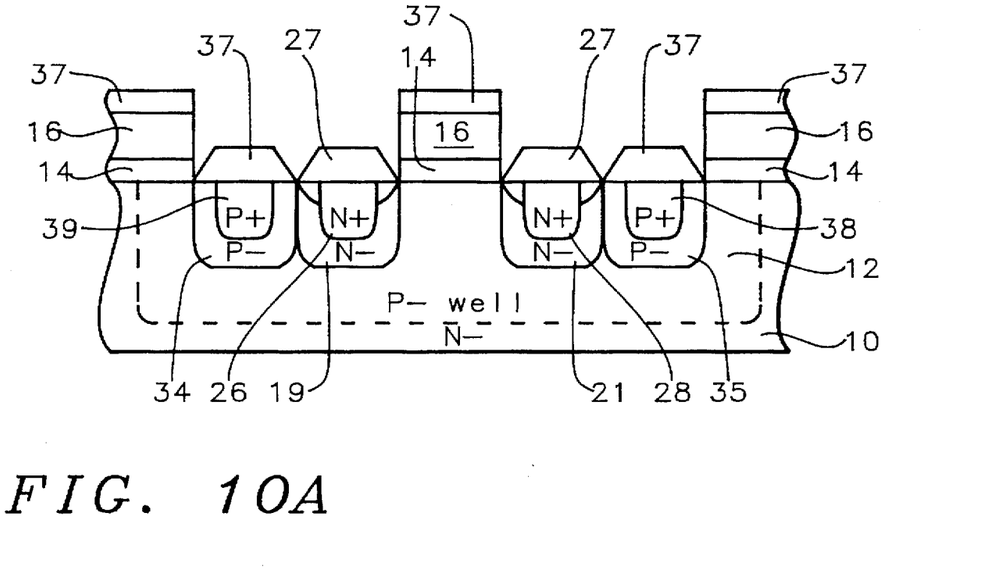
FIGS. 10A and 10B, a P type oxidation has been performed oxidizing the exposed surface of regions of the substrate forming structures above those regions and forming a layer above the silicon nitride layer.
Figure 10B:
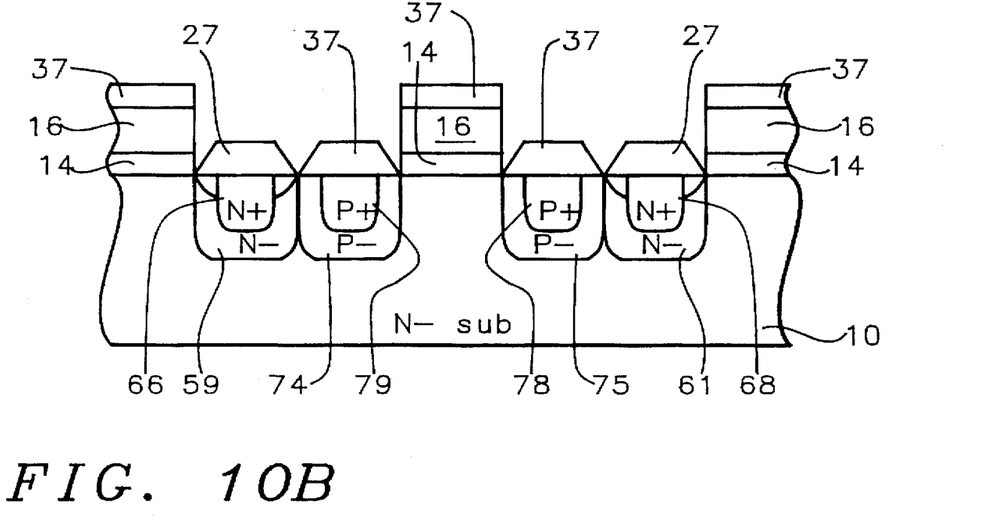

Next, referring to FIGS. 9A and 9B, in a series of steps analogous to those shown in FIGS. 3A, 3B, 4A, 4B, 5A and 5B (as described above) the layer of resist 30 is removed, and a new layer of resist 53 is applied a P+ mask is aligned and used t o expose the resist 53, which is developed. At this point the fourth ion implant process is performed in accordance with this invention. The P+ ions 63 are implanted into new P+ regions 38, 39, 78 and 79 in P− regions 34, 35, 74, and 75 as shown in FIGS. 10A and 10B. The chemical species of the dopant implanted is preferably boron (B) or BF$_2$ with a dose within an operable range from about 1 E 15 atoms/cm$^2$ to about 4 E 15 atoms/cm$^2$ at an energy of from about 50 keV to about 90 keV in a high current implanter type of tool. The optimum dose ranges from about 1 E 15 atoms/cm$^2$ to about 4 E 15 atoms/cm$^2$, resulting in a concentration of P+ dopant from about $8 \times 10^{18}$ atoms/cm$^3$ to about $3 \times 10^{19}$ atoms/cm$^3$.

After the ion implantation of the P+ ions, the P+ resist is removed and the silicon dioxide layer below openings 32, 36, 72 and 76 is removed.

As shown in FIGS. 10A and 10B, a P type oxidation has been performed oxidizing the exposed surface of regions 34, 35, 74 and 75 forming structures 37 above the regions 34, 35, 74 and 75 and forming the layer 37 above the silicon nitride layer 16.

Next, the oxide layer 37 above the nitride layer 16 is etched away exposing the surface of the nitride layer 16. Next, the nitride layer 16 is removed exposing the gate channel region between the oxidation structures 27. Bass oxide etching is performed next for the gate channel region where the nitride layer 16 was removed between the regions 19 and 21 in FIG. 10A and regions 59 and 61 in FIG. 10B.

Figure 11A:
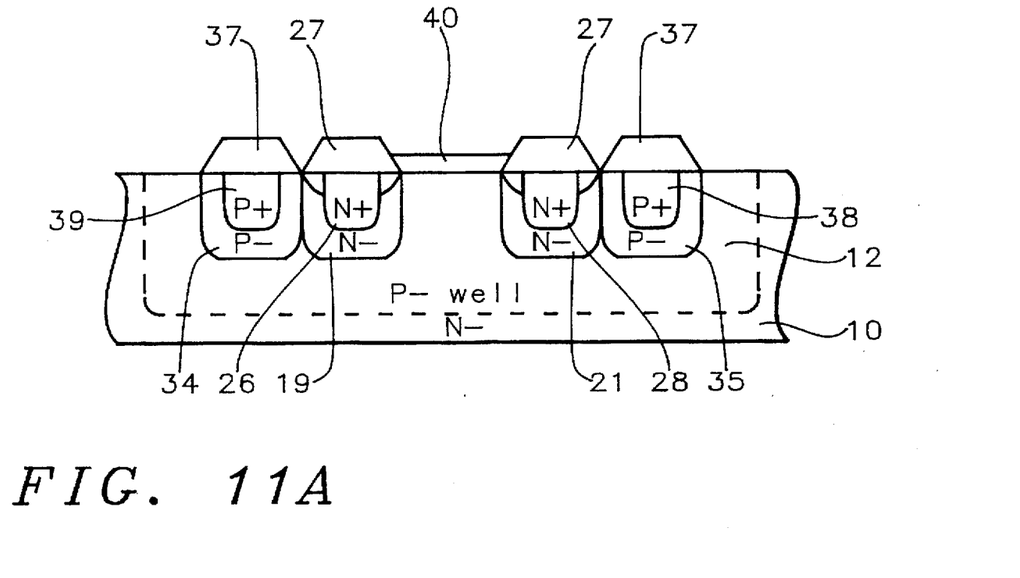
FIGS. 11A and 11B, the gate oxide layers have been formed by gate oxide oxidation on the area where the bass oxide etching was performed.
Figure 11B:
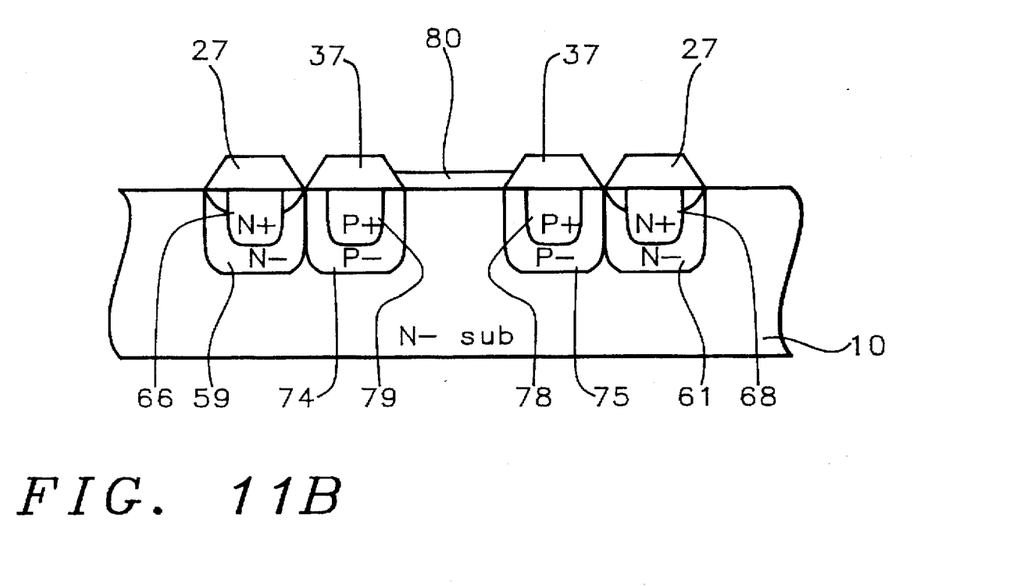

As shown in FIGS. 11A and 11B, the gate oxide layers 40 and 80 respectively have been formed by gate oxide oxidation on the area where the bass oxide etching was performed.

A photolithographic process has formed the photoresist mask on the product of FIGS. 11A and 11B using the process described above. Openings (not shown) for electrical contacts to the source and drain and substrate contact have been formed, and contacts have been formed by the process of elope etching. Then the photoresist mask is removed.

Figure 12A:
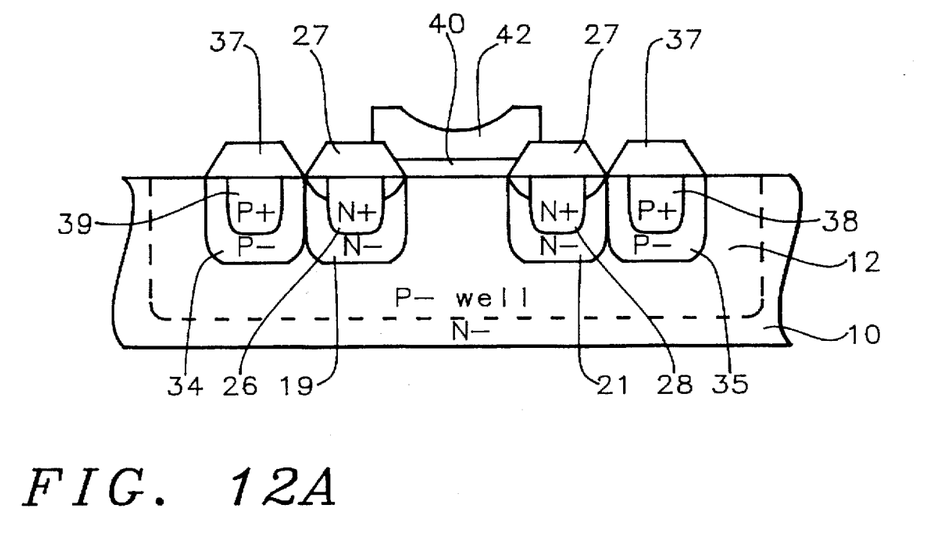
FIGS. 12A and 12B, a gate 42 is formed. The process for forming the gate 42 includes premetal etching of oxide.
Figure 12B:
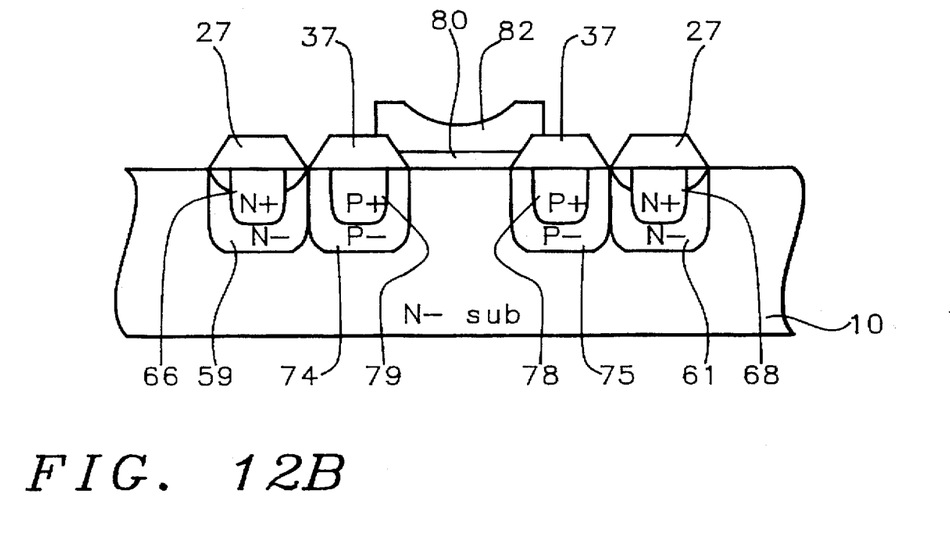

Referring to FIGS. 12A and 12B, a gate 42 is formed. The process for forming the gate 42 includes premetal etching of oxide.

Next, metal is sputtered onto the wafer for forming the gate 42. Next, metal etching is performed by a process of dry or wet etching.

Figure 13:
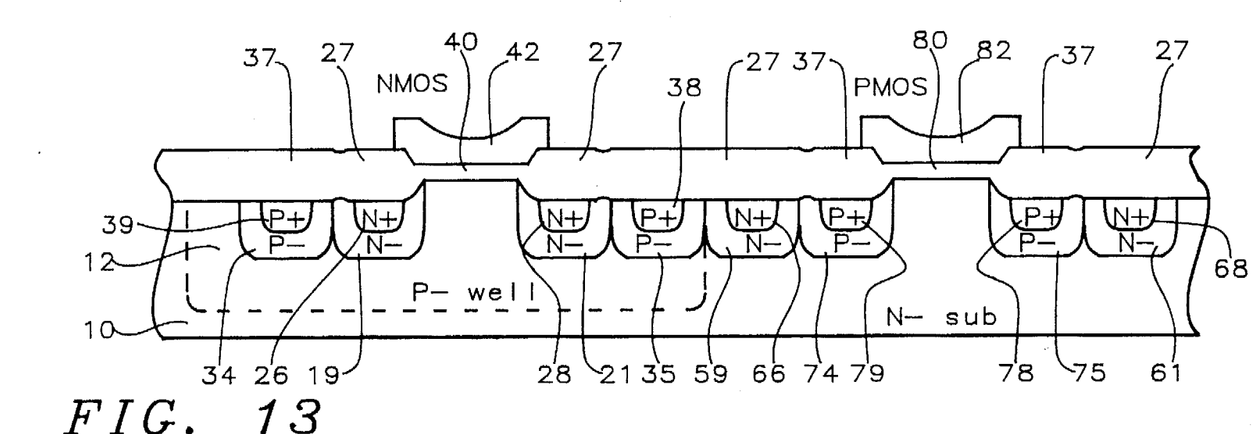
FIG. 13, is a composite of the structures of FIGS. 12A and 12B.

Referring to FIG. 13, a composite of the structures of FIGS. 12A and 12B with the NMOS device formed in well 12 and the PMOS device formed in the N-sub 10. In the MOS device, the source Comprises N+ region 26 which is surrounded by drift region 19. The drain 28 is surrounded by drift region 21. The P+ region 39 is a P-well substrate contact and the surrounding P– region 34 is a P-well substrate contact.

In the PMOS device P– region 74 and P– region 75 provide P– drift regions for the P+ source and drain 66 and 78. The N+ region 66 and N– region 59 provide a substrate contact to substrate 10. N– region 61 comprises an N– substrate contact. N+ region 68 is also an N– substrate contact.

Figure 14:
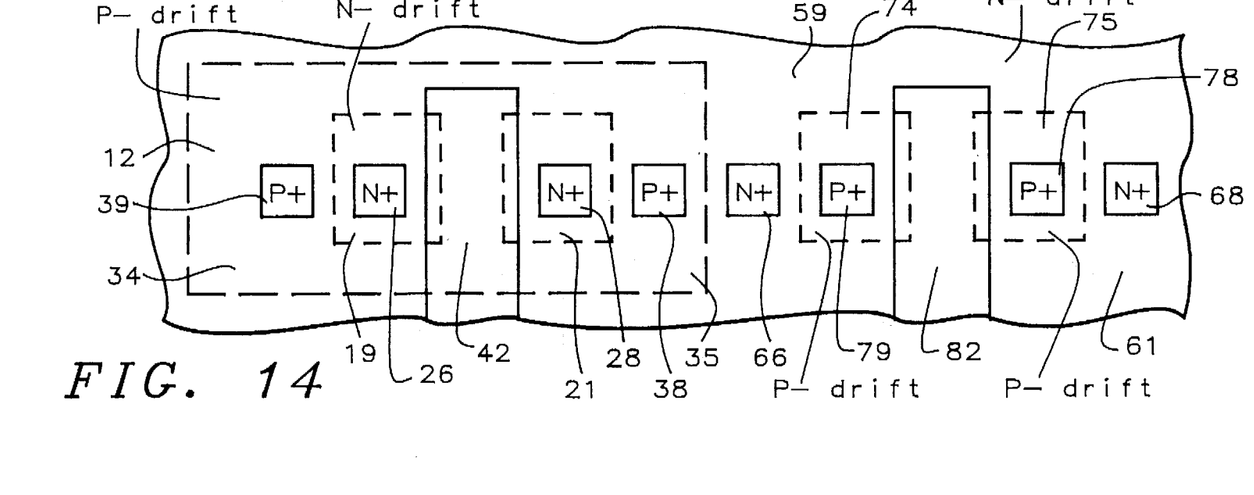
FIG. 14 is a top view of the device of FIG. 13 showing the contacts, etc.

FIG. 14 is a top view of the device of FIGS. 13 showing the contacts, etc.

With respect to the order of implanting N+/N– before P+/P– when one uses a two step field oxidation, one can easily control the N–/N+ and P–/P+ junction depth, but alternatively one can reverse the process.

The N+/N– process steps are performed first because the N+/N– diffusion coefficients are smaller than the P+/P– diffusion coefficients. In practice, one can change this sequence. In the case of a single step field oxidation, one can change the sequence also.

While this invention has been described in terms of the above specific embodiment(s), those skilled in the art will recognize that the invention can be practiced with modifications within the spirit and scope of the appended claims, i.e. that changes can be made in form and detail, invention. Accordingly all such changes come within the purview of the present invention and the invention encompasses the subject matter of the claims which follow.

Having thus described the invention, what is claimed as new and desirable to be secured by Letters Patent is as follows:

1. An integrated circuit device comprising:
    a PMOS device in an N-type region of a substrate, the PMOS device comprising a P-type source region and a P-type drain region on either side of a PMOS channel region, PMOS P-type drift regions surrounding each of the P-type source and P-type drain regions, a PMOS gate electrode over the PMOS channel region, and a PMOS N-type drift region surrounding each of the PMOS P-type drift regions, the P-type source and P-type drain regions, and the PMOS channel region;
    a pair of N-type regions having locally higher N-type dopant concentrations in the PMOS N-type drift regions disposed on opposite sides of the PMOS channel region, with the P-type source and drain regions lying between the pair of N-type regions;
    an NMOS device in a P-type region of the substrate, the NMOS device comprising an N-type source region and an N-type drain region on either side of an NMOS channel region, NMOS N-type drift regions surrounding each of the N-type source and N-type drain regions, an NMOS gate electrode over the NMOS channel region, and an NMOS P-type drift region surrounding each of the NMOS N-type drift regions, and the N-type source and N-type drain regions, and the PMOS channel region; and
    a pair of P-type regions having locally higher P-type dopant concentrations in the NMOS P-type drift regions disposed on opposite sides of the NMOS channel region, with the N-type source and drain regions lying between the pair of P-type regions.

2. The integrated circuit device of claim 1, wherein the P-type region of the substrate touches the N-type region of the substrate.

3. The integrated circuit device of claim 1, wherein the pair of N-type regions and the pair of P-type regions lie along a single line.

4. The integrated circuit device of claim 1, wherein the P-type source and P-type drain regions have a higher concentration of P-type dopants than the PMOS P-type drift regions and the PMOS N-type drift region has a higher concentration of N-type dopants than the N-type region of the substrate, and
    wherein the N-type source and N-type drain regions have a higher concentration of N-type dopants than the NMOS N-type drift regions and the NMOS P-type drift region has a higher concentration of P-type dopants than the P-type region of the substrate.

5. The integrated circuit device of claim 4, wherein the PMOS N-type drift region touches the NMOS P-type drift region.

6. The integrated circuit device of claim 5, wherein the NMOS gate electrode and the PMOS gate electrode comprise aluminum.

7. The integrated circuit device of claim 4, wherein the PMOS P-type drift regions and the PMOS N-type drift region extend to approximately the same depth in the substrate.

8. The integrated circuit device of claim 7, wherein the NMOS N-type drift regions and the NMOS P-type drift region extend to approximately the same depth in the substrate.

9. The integrated circuit device of claim 7, wherein the NMOS N-type drift regions and the NMOS P-type drift region extend to approximately the same depth in the substrate.

10. The integrated circuit device of claim 4, wherein the NMOS gate electrode extends over the NMOS N-type drift regions on either side of the NMOS channel region.

11. The integrated circuit device of claim 4, wherein the PMOS gate electrode extends over the PMOS P-type drift regions on either side of the PMOS channel region.

12. The integrated circuit device of claim 4, wherein the NMOS N-type drift regions extend below all of the N-type source and drain regions and extend laterally around the N-type source and drain regions.

13. The integrated circuit device of claim 4, wherein the PMOS P-type drift regions extend below all of the P-type source and drain regions and extend laterally around the P-type source and drain regions.

14. The integrated circuit device of claim 4, wherein the NMOS gate electrode and the PMOS gate electrode comprise metal.

15. An integrated circuit device comprising:
    a PMOS device on an N-type region of a substrate, the PMOS device comprising a P-type source region and a P-type drain region on either side of a PMOS channel region, oxidation structures on the P-type source and drain regions, PMOS P-type drift regions surrounding each of the P-type source and P-type drain regions, a PMOS gate electrode over the PMOS channel region, and a PMOS N-type drip region surrounding each of the PMOS P-type drift regions, the P-type source and P-type drain regions, and the PMOS channel region;
    a pair of N-type regions having locally higher N-type dopant concentrations in the PMOS N-type drift regions disposed on opposite sides of the PMOS channel region, with the P-type source and drain regions lying between the pair of N-type regions;

an NMOS device on a P-type region of the substrate, the PMOS device comprising an N-type source region and an N-type drain region on either side of an NMOS channel region, oxidation structures on the N-type source and drain regions, NMOS N-type drift regions surrounding each of the N-type source and N-type drain regions, and NMOS gate electrode over the NMOS channel region, and an NMOS P-type drift region surrounding each of the NMOS N-type drift regions, the N-type source and N-type drain regions, and the NMOS channel region; and a pair off P-type regions having locally higher P-type dopant concentrations in the NMOS P-type drift regions disposed on opposite sides of the NMOS channel region, with the N-type source and drain regions lying between the pair of P-type regions.

16. An integrated circuit device comprising:

a PMOS device on an N-type region of a substrate, the PMOS device comprising a P-type source region and a P-type drain region on either side of a PMOS channel region, PMOS P-type drift regions surrounding each of the P-type source and P-type drain regions, a metal PMOS gate electrode over the PMOS channel region, and a PMOS N-type drift region surrounding each of the PMOS P-type drift regions, the PMOS P-type drift regions and the PMOS N-type drift region extending to approximately the same depth in the substrate, the P-type source and P-type drain regions, and the PMOS channel regions the P-type source and P-type drain regions having a higher concentration of P-type dopants than the PMOS P-type drift regions and the PMOS N-type drift region having a higher concentration off N-type dopants than the N-type region of the substrate;

a pair of N-type regions having locally higher N-type dopant concentrations in the PMOS N-type drift regions disposed on opposite sides of the PMOS channel region, with the P-type source and drain regions lying between the pair of N-type regions;

an NMOS device on a P-type region of the substrate, the NMOS device comprising an N-type source region and an N-type drain region on either side of an NMOS channel region, NMOS N-type drift regions surrounding each of the N-type source and N-type drain regions, and a metal NMOS gate electrode over the NMOS channel region, and an NMOS P-type drift region surrounding each of the NMOS N-type drift regions, the NMOS N-type drift regions and the NMOS P-type drift region extending to approximately the same depth in the substrate, the N-type source and N-type drain regions, and the NMOS channel region, the N-type source and N-type drain regions having a higher concentration of N-type dopants than the NMOS N-type drift regions and the NMOS P-type drift region having a higher concentration of P-type dopants than the P-type region of the substrate; and a pair of P-type regions having locally higher P-type dopant concentrations in the NMOS P-type drift regions disposed on opposite sides of the NMOS channel region, with the N-type source and drain regions lying between the pair of P-type regions.

17. The integrated circuit device of claim 16, further comprising oxidation structures on the P-type source and drain regions and on the N-type source and drain regions.

* * * * *